(12) United States Patent
Lee et al.

(10) Patent No.: US 7,795,670 B2
(45) Date of Patent: Sep. 14, 2010

(54) SEMICONDUCTOR DEVICE AND METHOD FOR FABRICATING THE SAME

(75) Inventors: Sang Don Lee, Gyeonggi-do (KR); Jae Goan Jeong, Gyeonggi-do (KR)

(73) Assignee: Hynix Semiconductor Inc., Icheon-si (KR)

(*) Notice: Subject to any disclaimer, the term of this patent is extended or adjusted under 35 U.S.C. 154(b) by 335 days.

(21) Appl. No.: 11/279,637

(22) Filed: Apr. 13, 2006

(65) Prior Publication Data

US 2007/0173007 A1 Jul. 26, 2007

(30) Foreign Application Priority Data

Jan. 23, 2006 (KR) .................. 10-2006-0006964

(51) Int. Cl.
 *H01L 27/108* (2006.01)
(52) U.S. Cl. .................. 257/330; 257/304; 257/311; 257/331; 257/332; 257/333; 257/334; 257/396
(58) Field of Classification Search ................ 257/304, 257/311, 330–334, 396
See application file for complete search history.

(56) References Cited

U.S. PATENT DOCUMENTS

| 5,982,008 A | 11/1999 | Kajiyama |
| 6,175,140 B1 | 1/2001 | Kajiyama |
| 6,476,444 B1 * | 11/2002 | Min .............................. 257/330 |
| 6,525,360 B2 | 2/2003 | Kajiyama |
| 6,958,518 B2 * | 10/2005 | Wylie ........................ 257/395 |
| 2005/0133836 A1 * | 6/2005 | Seo et al. ..................... 257/288 |
| 2006/0113590 A1 * | 6/2006 | Kim et al. .................... 257/330 |
| 2006/0237817 A1 * | 10/2006 | Park ............................ 257/500 |

FOREIGN PATENT DOCUMENTS

| KR | 10-1992-0010695 B1 | 12/1992 |
| KR | 10-2001-0065334 A | 7/2001 |
| TW | 489410 B | 6/2002 |
| TW | 515048 B | 12/2002 |
| TW | 586235 B | 5/2004 |

OTHER PUBLICATIONS

Taiwan Intellectual Property Office, Preliminary Examination Report, Application No. 95111905, Mar. 27, 2008.
Kim et al., "S-RCAT (Sphere-shaped-Recess-Channel-Array-Transistor) Technology for 70 nm DRAM feature size and beyond," 2005 Symposium on VLSI Technology Digest of Technical Papers, pp. 34-35.

* cited by examiner

*Primary Examiner*—Kevin M Picardat
*Assistant Examiner*—Bac H Au
(74) *Attorney, Agent, or Firm*—Townsend and Townsend and Crew LLP

(57) ABSTRACT

The semiconductor device includes an active region, a recess channel region, a storage node junction region, a gate insulating film, and a gate electrode. The active region is defined by a device isolation structure formed in a semiconductor substrate, wherein a lower part of sidewalls of the active region is recessed. The recess channel is formed in the semiconductor substrate under the active region, wherein the recess channel has a vertical channel region and a horizontal channel region. The storage node junction region is formed over the device isolation structure and the semiconductor substrate. The gate insulating film is formed over the active region including the recess channel region. The gate electrode is formed over the gate insulating film to fill up the recess channel region.

2 Claims, 9 Drawing Sheets

SEMICONDUCTOR DEVICE AND METHOD FOR FABRICATING THE SAME

BACKGROUND OF THE INVENTION

The present invention relates to a memory device. More particularly, the present invention relates to a semiconductor device and a method for fabricating the same wherein a lower part of sidewalls of an active region where a storage node junction region is to be formed is etched, and a portion of the storage node junction region is formed over a device isolation structure to form a vertical SOI (Silicon-on-Insulator) channel region, thereby increasing write/read speed characteristics of the device and improving a refresh characteristic of the device.

When a channel length of a cell transistor is decreased, an ion concentration of a cell channel region is generally increased in order to maintain a threshold voltage of the cell transistor. An electric field in source/drain regions of the cell transistor is enhanced to increase leakage current, which results in degradation of a refresh characteristic of a DRAM structure. Therefore, there is a need for semiconductor devices in which the refresh characteristic is improved.

FIG. 1 is a simplified layout of a conventional semiconductor device, wherein reference numerals 1, 2, and 3 denote an active region, a recess gate region, and a gate region, respectively.

Referring to FIG. 1, a width of the recess gate region 2 is less than that of the gate region 3 by a distance 2D. A distance F is the distance between the neighboring gate regions 3.

FIGS. 2a through 2g are simplified cross-sectional views illustrating a conventional method for fabricating a semiconductor device, wherein FIGS. 2a(i) through 2g(i) are cross-sectional views taken along the line I-I' of FIG. 1, and FIGS. 2a(ii) through 2g(ii) are cross-sectional views taken along the line II-II' of FIG. 1.

Referring to FIG. 2a, a device isolation structure 50 is formed on a semiconductor substrate 10 having a pad oxide film 13 and a pad nitride film 15.

Referring to FIG. 2b, the pad nitride film 15 is removed. Ion implantation is performed on the entire surface to form a well and ion implantation region (not shown) in the semiconductor substrate 10. A planarized polysilicon layer 45 is formed on the entire surface of the resultant.

Referring to FIG. 2c, the polysilicon layer 45 and the pad oxide film 13 are etched using a recess gate mask (not shown) as an etching mask to form a polysilicon layer pattern 45a and a pad oxide film pattern 13a to define the recess gate region 2 shown in FIG. 1.

Referring to FIG. 2d, a predetermined thickness of the semiconductor substrate 10 in the recess gate region 2 shown in FIG. 1 is etched to form a first recess 53. The polysilicon layer pattern 45a is removed during a process for forming the first recess 53. In addition, a silicon horn is formed at the semiconductor substrate 10 near to the device isolation structure 50 because the etching rate of the semiconductor substrate 10 near to the device isolation structure 50 is relatively slower than that of the semiconductor substrate 10 far from the device isolation structure 50.

Referring to FIG. 2e, CVD oxide spacers 47 are formed on sidewalls of the first recess 53 and the pad oxide film pattern 13a. The semiconductor substrate 10 exposed at the bottom of the first recess 53 is etched by a predetermined thickness to form a second recess 55.

Referring to FIG. 2f, the spacers 47 and the pad oxide film pattern 13a are removed to expose the semiconductor substrate 10. A gate insulating film 60 is formed on the exposed semiconductor substrate 10. A planarized gate conductive layer 65 filling up the second recess 55 is formed over the gate insulating film 60. A gate hard mask layer 90 is formed over the gate conductive layer 65. Here, the gate conductive layer 65 is a stacked structure of a lower gate conductive layer 70 and an upper gate conductive layer 80.

Referring to 2g, the hard mask layer 90 and the gate conductive layer 65 are etched using a gate mask (not shown) as an etching mask to form a gate 99. Here, a gate channel region (L1+L2+L3), which is disposed under a storage node junction region 5 to be formed in a subsequent process, includes a vertical channel region L1, L3 and a horizontal channel region L2.

The subsequent process for forming storage node junction region 5 may be done by known semiconductor fabrication processes.

According to the above conventional method for fabricating a semiconductor device, the total length (L1+L2+L3) of the gate channel region is enlarged according to increase in a depth of the vertical channel region L1, L3 or a width of the horizontal channel region L2. In particular, in order to increase the width of the horizontal channel region L2, the etching process for the second recess may be performed using an isotropic etching method.

However, increasing the width of the horizontal channel region L2 increases a channel resistance. As a result, the total resistance of a transistor is increased. Accordingly, read/write speed characteristics of the DRAM device are less favorable a driving current of the device is decreased.

BRIEF SUMMARY OF THE INVENTION

The present invention relates to a semiconductor device and a method for fabricating the same wherein a lower part of sidewalls of an active region where a storage node junction region is to be formed is etched, and a portion of the storage node junction region is formed over a device isolation film to form a vertical SOI (Silicon-on-Insulator) channel region, thereby increasing write/read speed characteristics of the device and improving a refresh characteristic of the device.

According to an embodiment of the present invention, a semiconductor device includes: a device isolation structure formed in a semiconductor substrate to define an active region, wherein a lower part of sidewalls of the active region is recessed; a recess channel formed in the semiconductor substrate under the active region, the recess channel having a vertical channel region and a horizontal channel region; a storage node junction region formed over the device isolation structure and the semiconductor substrate; a gate insulating film formed over the active region including the recess channel region; and a gate electrode formed over the gate insulating film to fill up the recess channel region.

According to another embodiment of the present invention, a method for fabricating a semiconductor device includes: (a) forming a pad insulating film on a semiconductor substrate; (b) etching the pad interlayer insulating film and the semiconductor substrate using a device isolation mask as an etching mask to form a trench defining an active region, wherein a lower part of sidewalls of the active region is recessed; (c) forming a device isolation structure that fills the trench; (d) removing the pad insulating film after the device isolation structure has been formed to expose the semiconductor substrate; (e) etching the exposed semiconductor substrate using a recess gate mask as an etching mask to form a recess; (f) forming a gate insulating film on the exposed semiconductor substrate; (g) forming a gate conductive layer filling the recess; (h) forming a gate hard mask layer over the gate conductive layer; and (i) patterning the gate hard mask layer and the gate conductive layer using a gate mask as an etching mask to form a gate.

DETAILED DESCRIPTION OF THE INVENTION

Reference will now be made in detail to exemplary embodiments of the present invention. Wherever possible, the same reference numbers will be used throughout the drawings to refer to the same or like parts. It should be appreciated that the embodiments are provided to describe and enable the invention to those skilled in the art. Accordingly, the embodiments described herein may be modified without departing from the scope of the present invention.

Figure 1:
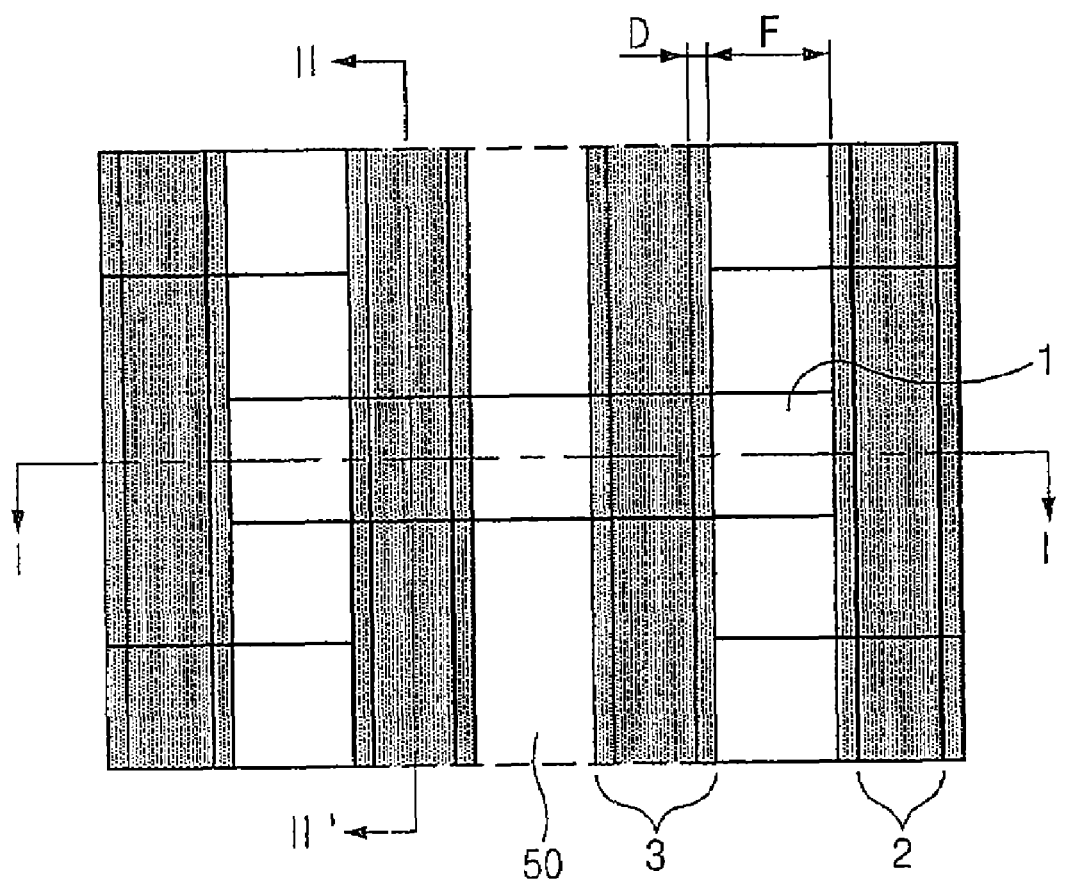
FIG. 1 is a simplified layout of a conventional semiconductor device.
Figure 2A:
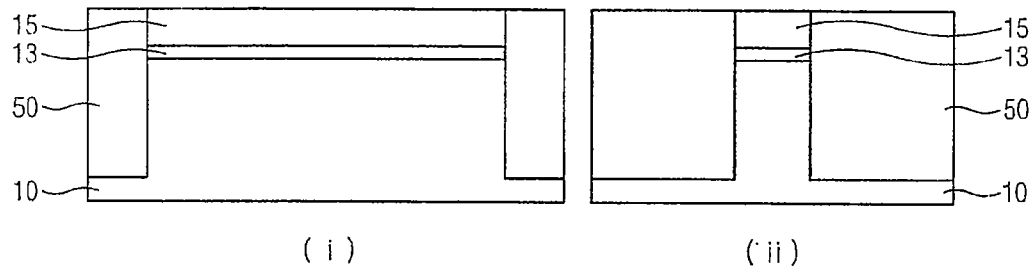
FIGS. 2a through 2g are simplified cross-sectional views illustrating a conventional method for fabricating a semiconductor device.
Figure 2B:
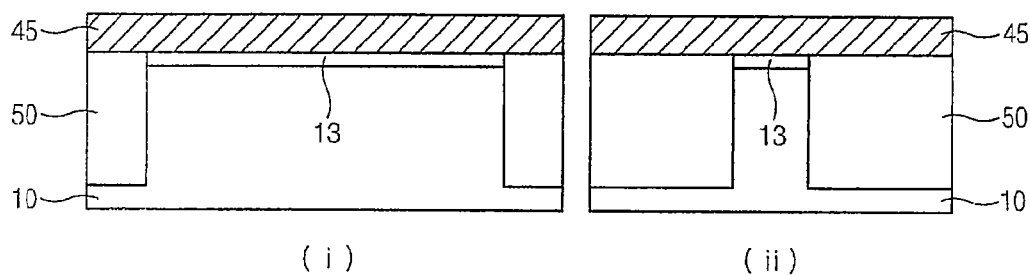
Figure 2C:
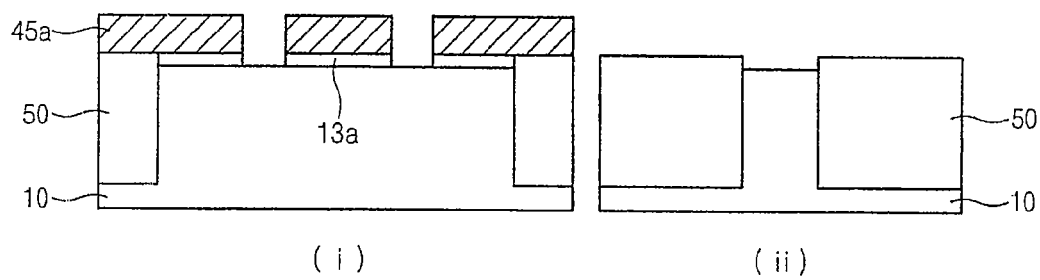
Figure 2D:
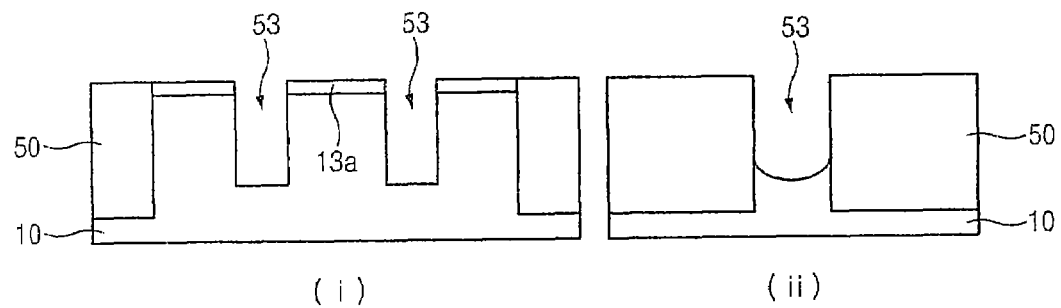
Figure 2E:
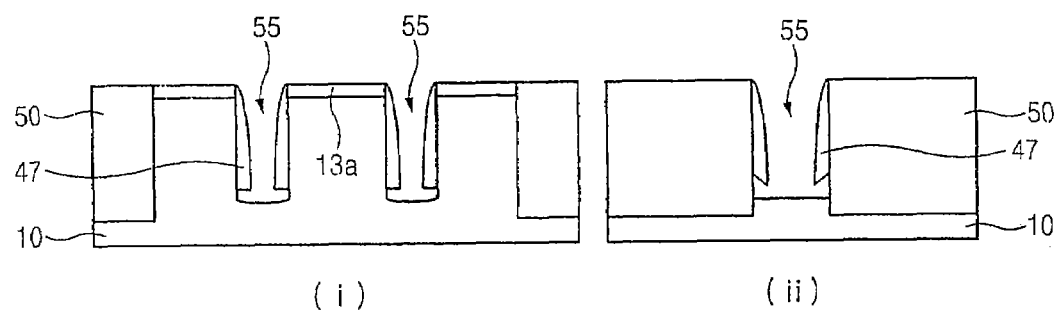
Figure 2F:
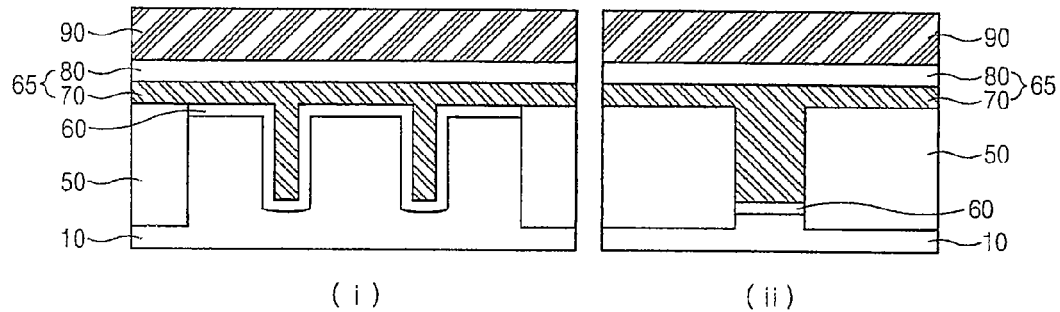
Figure 2G:
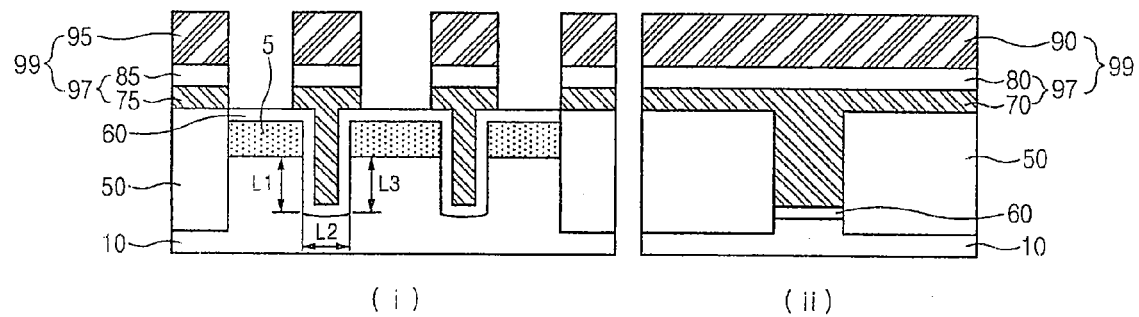
Figure 3:
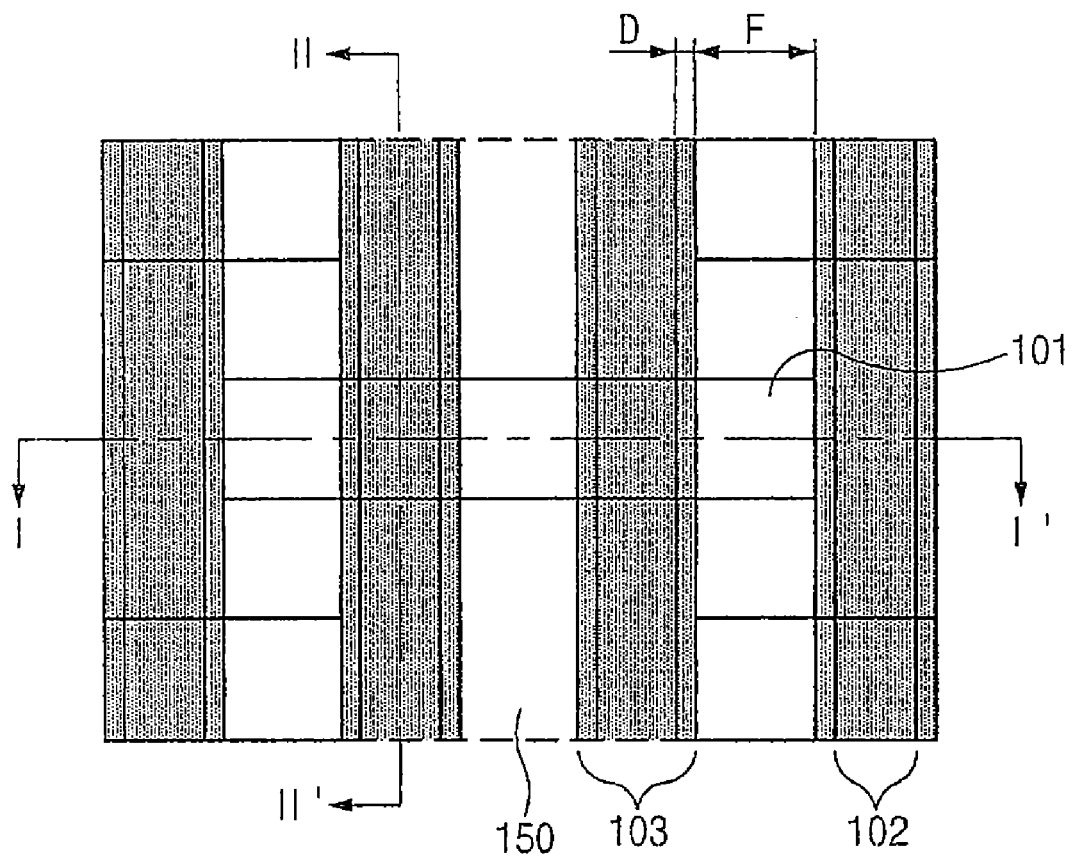
FIG. 3 is a simplified layout of a semiconductor device according to an embodiment of the present invention.

FIG. 3 is a simplified layout of a semiconductor device according to an embodiment of the present invention, wherein reference numerals 101, 102, and 103 denote an active region defined by the device isolation structure 150, a recess gate region, and a gate region, respectively.

Referring to FIG. 3, a width of the recess gate region 102 is less than that of the gate region 103 by a distance 2D, wherein distance F is the distance between the neighboring gate regions 103.

Figure 4:
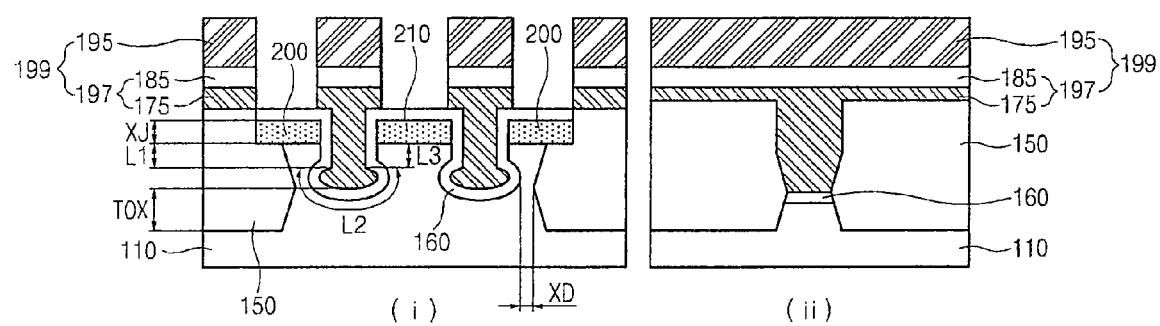
FIG. 4 is a simplified cross-sectional view illustrating a semiconductor device according to an embodiment of the present invention.

FIG. 4 is a simplified cross-sectional view of a semiconductor device according to an embodiment of the present invention, wherein FIG. 4(i) is a cross-sectional view taken along a longitudinal direction in accordance with the line I-I' of FIG. 3 and FIG. 4(ii) is a cross-sectional view taken along a latitudinal direction in accordance with the line II-II' of FIG. 3.

Referring to FIG. 4, a device isolation structure 150 defining the active region 101 shown in FIG. 3 is formed in a semiconductor substrate 110, wherein a lower part of sidewalls of the active region 101 is recessed (i.e., the lower part of sidewalls of active region 101 are slanted at an angle). A recess channel region (L1+L2+L3) is formed in the semiconductor substrate 110 under the recess gate region 102 shown in FIG. 3, and includes a vertical channel region L1, L3 and a horizontal channel region L2. A storage node junction region 200 is formed over the device isolation structure 150 and the semiconductor substrate 110 while a bit line junction region 210 is formed over the semiconductor substrate 110. In addition, a gate insulating film 160 is formed on the semiconductor substrate 110 including the recess channel region (L1+L2+L3). A gate 199 corresponding to gate region 103 (FIG. 3) is formed over the gate insulating film 160. Gate 199 comprises a stacked structure of a gate electrode 197 and a gate hard mask layer pattern 195. In one embodiment, gate electrode 197 includes a stacked structure of a lower gate electrode 175 and an upper gate electrode 185.

In one embodiment of the present invention, a depth XJ of the storage node junction region 200 over the device isolation structure 150 is equal to or less than a depth of the storage node junction region 200 over the semiconductor substrate 110. In one embodiment, the thickness of an upper part of the semiconductor substrate 110 between the vertical channel region L1 and its neighboring device isolation structure 150 is equal to or greater than that of its lower part, in accordance with the recessed part of the active region. Further, in a longitudinal direction of the active region 101 shown in FIG. 3, the width of a lower part of the horizontal channel region L2 is equal to or greater than that of its upper part. In some embodiments, the shape of the channel region L2 is elliptical or circular.

According to an embodiment of the present invention, a vertical SOI (Silicon-on-Insulator) channel region is formed between the vertical channel region L1 and its neighboring device isolation structure 150 so as to decrease leakage current of the storage node junction region 200. As a result, the refresh characteristic of the device can be improved. With formation of the vertical SOI channel region, SCE (Short channel effect) is improved so as to increase the driving current of the device. Accordingly, read/write speed characteristics of the device can be improved.

Figure 5A:
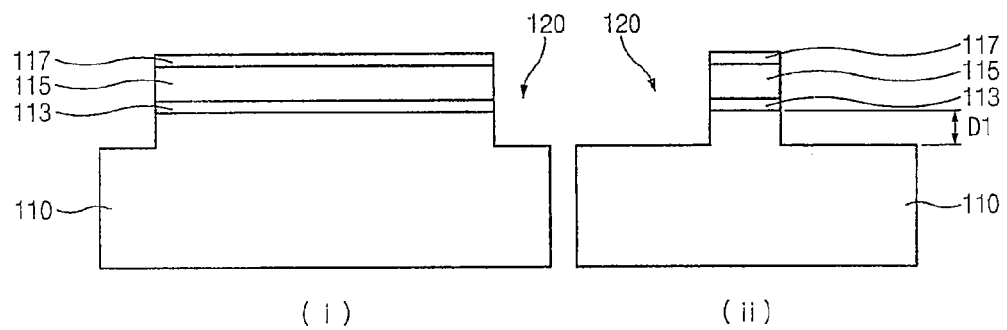
FIGS. 5a through 5g are simplified cross-sectional views illustrating a method for fabricating a semiconductor device according to an embodiment of the present invention.

FIGS. 5a through 5g are simplified cross-sectional views illustrating a method for fabricating a semiconductor device according to an embodiment of the present invention, wherein FIGS. 5a(i) through 5g(i) are cross-sectional views taken along a longitudinal direction in accordance with the line I-I' of FIG. 3 and FIGS. 5a(ii) through 5g(ii) are cross-sectional views taken along a latitudinal direction in accordance with the line II-II' of FIG. 3.

Referring to FIG. 5a, a pad oxide film 113, a pad nitride film 115, and a first hard mask layer 117 are sequentially formed over a semiconductor substrate 110. A photoresist film (not shown) is formed on the first hard mask layer 117, and exposed and developed using a device isolation mask (not shown) to form a photoresist film pattern (not shown) defining a device isolation region 150 shown in FIG. 3. The first hard mask layer 117, the pad nitride film 115, the pad oxide film 113, and a predetermined thickness of the semiconductor substrate 110 are etched to form a first trench 120 defining an active region 101 shown in FIG. 3. The photoresist film pattern is then removed. Here, the predetermined thickness D1 of the semiconductor substrate 110 etched in the first trench 120 can be adjusted according to the thickness of a storage node junction region, which is to be formed in a subsequent process. In one embodiment, the first hard mask layer 117 is made from an oxide film, a polysilicon layer, or a combination thereof.

Figure 5B:
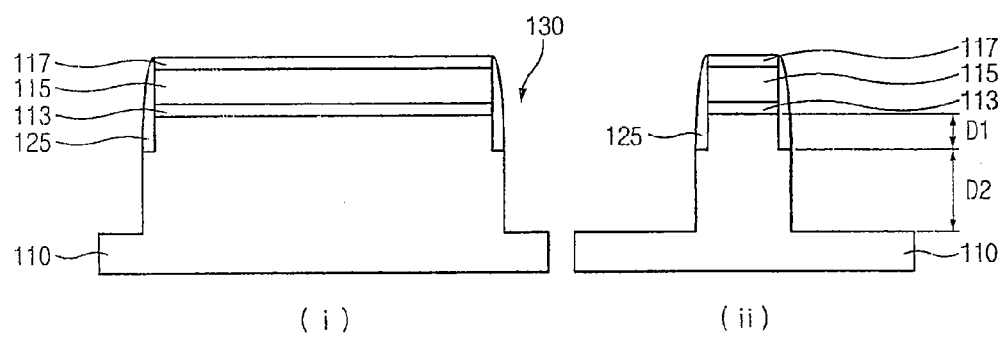

Referring to FIG. 5b, a first insulating film (not shown) is formed over the entire surface of the resultant. The first insulating film is then etched to form first spacers 125 on sidewalls of a stacked structure defined by the first trench 120. A predetermined thickness of the semiconductor substrate 110 exposed at the bottom of the first trench 120 is etched to form a second trench 130. Here, the stacked structure includes the semiconductor substrate 110, the pad oxide film 113, the pad nitride film 115, and the first hard mask layer 117. A predetermined thickness D2 of the etched semiconductor substrate 110 for the second trench 130 can be also adjusted according to a thickness of a recess channel region, which is to be formed in a subsequent process, and a thickness of the device isolation structure 150 such that neighboring cell transistors can be electrically isolated. In one embodiment, the first insulating film is made from an oxide film, a stacked structure of an oxide film and a nitride film, or a stacked structure of an oxide film and a polysilicon layer.

Figure 5C:
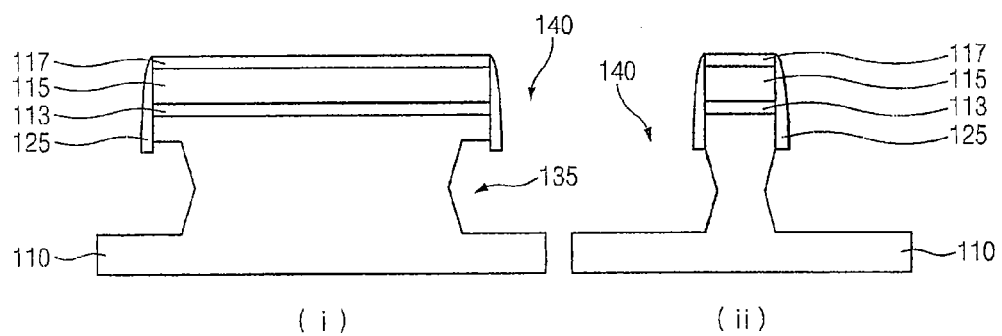

Referring to FIG. 5c, the semiconductor substrate 110 exposed at the bottom of the second trench 130 is etched to form a third trench 140 including an undercut space 135. Here, the undercut space 135 is formed by etching a predetermined thickness of the semiconductor substrate 110 under a storage node junction region to be formed in a subsequent process. In one embodiment, the etching process for the third trench 140 is performed using an isotropic etching method. Here, during the etching process, the etching rate in the longitudinal direction of the active region 101 shown in FIG. 3 is faster than that in the longitudinal direction of the gate region 103 shown in FIG. 3 so as to form the undercut space 135.

Figure 5D:
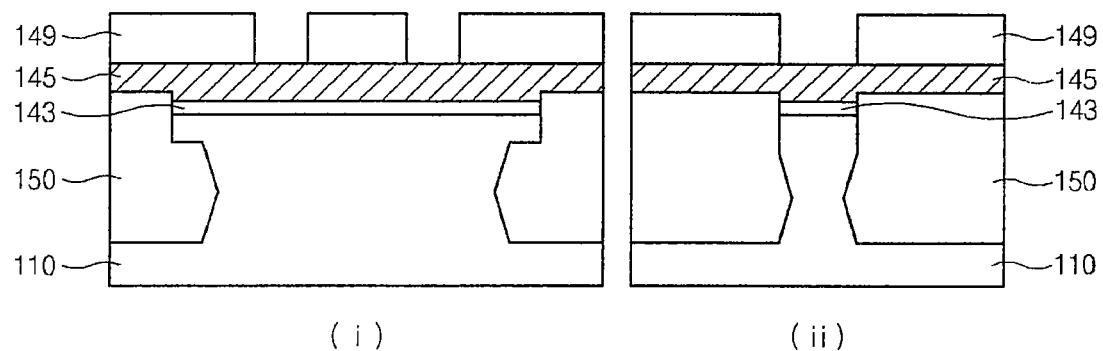

Referring to FIG. 5d, the first hard mask 117 and the first spacers 125 are removed. An insulating film for device isolation (not shown) filling up the third trench 140 including the undercut space 135 is formed. The insulating film for device isolation is polished until the pad nitride film 115 is exposed to form a device isolation structure 150. A predetermined thickness of the device isolation structure 150 is etched to lower the height of the device isolation structure 150. The pad nitride film 115 and the pad oxide film 113 are sequentially removed to expose the semiconductor substrate 110. A buffer oxide film 143 is formed over the exposed semiconductor substrate 110. A photoresist film (not shown) is formed over the entire surface of the resultant, and exposed and developed using a mask exposing a cell region to form a photoresist film pattern (not shown). Impurity ions are implanted on the entire surface using the photoresist film pattern as an ion implantation mask to form a well and channel ion implantation region (not shown) in the semiconductor substrate 110 under the buffer oxide film 143. The photoresist film pattern is then removed. A planarized second hard mask layer 145 is formed over the entire surface of the resultant. A photoresist film (not shown) is formed on the second hard mask layer 145, and then exposed and developed using a recess gate mask (not shown) to form a photoresist film pattern 149 defining the recess gate region 102 shown in FIG. 3. In one embodiment, the removing process for the first hard mask layer 117 and the first spacer 125 is performed using a wet etching process. The etching process for the device isolation structure is also performed using a wet etching process. In addition, the second hard mask layer 145 is made from a polysilicon layer, an amorphous Carbon film, a nitride film, a SiON film, or combinations thereof.

Figure 5E:
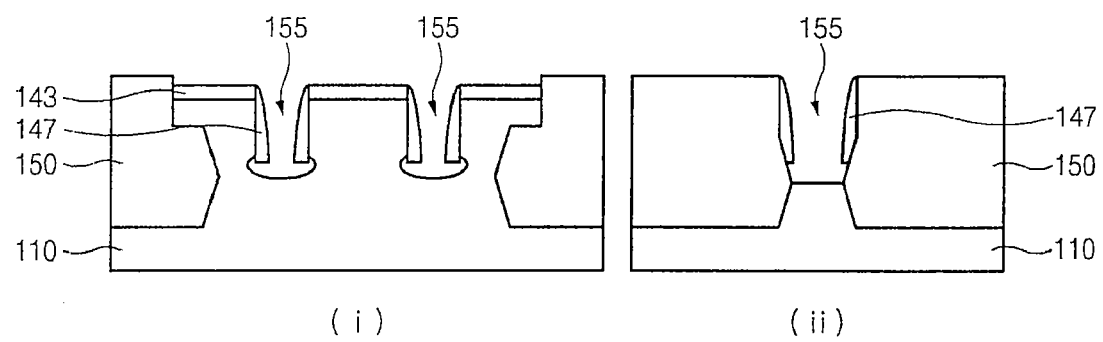

Referring to FIG. 5e, the second hard mask layer 145, the buffer oxide film 143, and a predetermined thickness of the semiconductor substrate 110 are etched using the photoresist film pattern 149 as an etching mask to form a first recess (not shown). The photoresist film pattern 149 and the second hard mask layer 145 are removed. A second insulating film (not shown) is formed on the entire surface of the resultant. The second insulating film is etched to form second spacers 147 on sidewalls of the first recess and the buffer oxide film 143. The semiconductor substrate 110 exposed at the bottom of the first recess is then etched using the second spacers 147 as an etching mask to form a second recess 155. In one embodiment, the photoresist film pattern and the second hard mask layer 145 are simultaneously removed. In addition, the second insulating film is made from an oxide film, a nitride film, or a stacked structure using a combination thereof. In one embodiment of the present invention, the etching process for the second recess 155 is performed using an isotropic etching method, so that the width of a lower part of the second recess 155 can be equal to or greater than that of its upper part. In addition, the shape of the lower part of the second recess 155 is elliptical or circular.

Figure 5F:
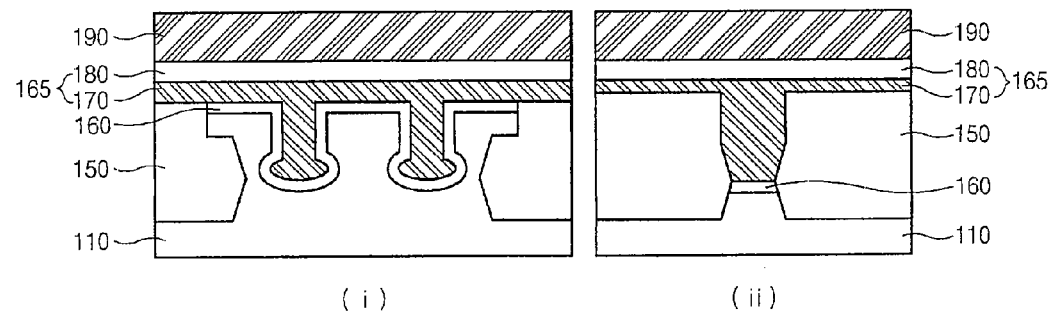

Referring to FIG. 5f, the second spacers 147 and the buffer oxide film 143 are removed to expose the semiconductor substrate 110. A gate insulating film 160 is formed on the exposed semiconductor substrate 110. A planarized lower gate conductive layer 170 filling up the second recess 155 is formed on the gate insulating film 160. An upper gate conductive layer 180 and a gate hard mask layer 190 are sequentially formed on the lower gate conductive layer 170. In one embodiment, the removing process for the second spacers 147 and the buffer oxide film 143 is performed using a wet etching method.

Figure 5G:
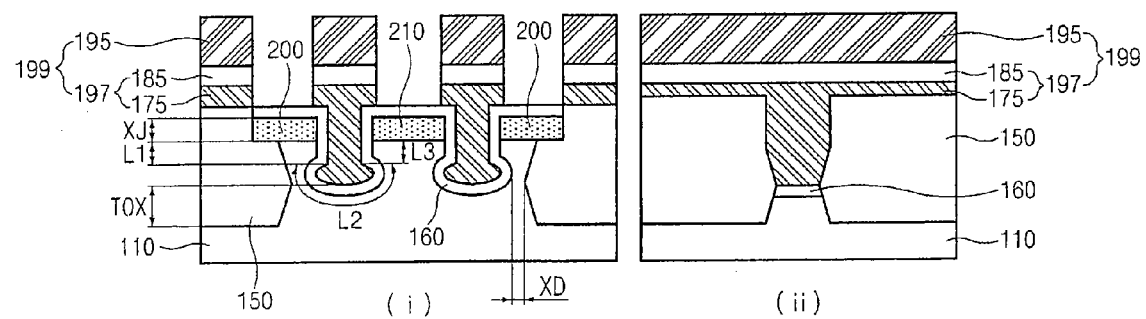

Referring to FIG. 5g, the gate hard mask layer 190, the upper gate conductive layer 180, and the lower gate conductive layer 170 are etched using a gate mask (not shown) as an etching mask to form a gate 199 corresponding to gate region 103 (FIG. 3). Here, the gate 199 includes a gate hard mask layer pattern 195 and a gate electrode 197, which is a stacked structure of an upper gate electrode 185 and a lower gate electrode 175. In one embodiment, the lower gate conductive layer 170 is made from a polysilicon layer, a SiGe layer, or a stacked structure using a combination thereof. In another embodiment, the upper gate conductive layer 180 is made from a TiN film, a WN film, a $WSi_x$ layer, a $TiSi_x$ layer, a Ti layer, a W layer, or combinations thereof. Here, the thickness XJ of the storage node junction region 200 over the device isolation structure 150 can be adjusted according to the thickness Dl of the etched semiconductor substrate 110 during the process for forming the first trench 120 shown in FIG. 5a. In addition, the minimum width XD of the semiconductor substrate 110, which is disposed under the storage node junction region 200, between the vertical channel region L1 and its neighboring device isolation structure 150 can be adjusted according to a vertical part of the etched semiconductor substrate 110 in the third trench 135 shown in FIG. 5c. Further, the depth TOX from the lower gate electrode 175 to the bottom of the device isolation structure 150 can be adjusted according to the thickness D2 of the etched semiconductor substrate 110 in the second trench 130 shown in FIG. 5b and the thickness of the device isolation structure 150 such that the neighboring cell transistors can be electrically isolated.

In addition, subsequent processes such as a process for forming a spacer on a sidewall of the gate, an ion-implantation process for forming source/drain regions in the active regions, a process for forming a landing plug, a process for forming a bit line contact and a bit line, a process for forming a capacitor, and a process for forming an interconnect may be performed.

As described above, the semiconductor substrate and method for fabricating the same in accordance with an embodiment of the present invention provides etching a lower part of sidewalls of a semiconductor substrate where a storage node junction region is to be formed and forming a portion of the storage node junction region on a device isolation film to form a vertical SOI (Silicon-on-Insulator) channel region (e.g., the region below storage node junction region 200, and between the vertical channel region L1 and neighboring device isolation structure 150) to decrease the area of the storage node junction region, thereby reducing its leakage current. Accordingly, refresh characteristics of the DRAM structure are improved.

In addition, SCE (Short channel effect) of the device is improved because of the vertical SOI channel region. The driving current of the device is increased due to the lower threshold voltage characteristic. Accordingly, the read/write speed characteristics of the DRAM structure are improved.

Further, since the width of the semiconductor substrate between the vertical channel region and its neighboring device isolation structure is narrow, a low electric field of the storage node junction region is maintained due to the reduced amount of doped ions diffusing into the storage node junction region. Accordingly, the device has improved refresh characteristics.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A semiconductor device comprising:
   a device isolation structure formed in a semiconductor substrate to define an active region, wherein an upper sidewall of the device isolation structure is sloped toward the active region and a lower sidewall of the device isolation structure is sloped away from the active region;
   a trench formed in the active region, wherein the trench includes a lower portion and an upper portion, the lower portion being wider than the upper portion;
   a recess channel region formed in the semiconductor substrate in the active region between the trench and the device isolation structure, wherein a thickness of an upper portion of the active region between the upper portion of the trench and the device isolation structure is greater than a thickness of a lower portion of the active region between the upper portion of the trench and the device isolation structure;
   a storage node junction region formed over the device isolation structure and the semiconductor substrate;
   a gate insulating film formed over the active region including the sidewalls of the trench; and
   a gate electrode formed over the gate insulating film to fill up the trench.

2. The semiconductor device according to claim 1, wherein a thickness of the storage node junction region over the device isolation structure is equal to or less than that of the storage node junction region over the semiconductor substrate.

* * * * *